(12) United States Patent
Tsai et al.

(10) Patent No.: US 11,081,563 B2
(45) Date of Patent: Aug. 3, 2021

(54) FORMATION OF SILICIDE CONTACTS IN SEMICONDUCTOR DEVICES

(71) Applicant: Taiwan Semiconductor Manufacturing Company, Ltd., Hsin-Chu (TW)

(72) Inventors: Yan-Ming Tsai, Miaoli County (TW); Wei-Jung Lin, Taipei (TW); Fang-Cheng Chen, Hsin-Chu (TW); Chii-Ming Wu, Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 5 days.

(21) Appl. No.: 14/839,597

(22) Filed: Aug. 28, 2015

(65) Prior Publication Data
US 2015/0380509 A1     Dec. 31, 2015

Related U.S. Application Data

(62) Division of application No. 14/157,927, filed on Jan. 17, 2014, now Pat. No. 9,129,842.

(51) Int. Cl.
*H01L 29/45*     (2006.01)
*H01L 27/092*    (2006.01)
(Continued)

(52) U.S. Cl.
CPC ...... *H01L 29/456* (2013.01); *H01L 21/26506* (2013.01); *H01L 21/28518* (2013.01);
(Continued)

(58) Field of Classification Search
CPC ........... H01L 21/823814; H01L 29/665; H01L 21/28518; H01L 21/32053; H01L 21/76843; H01L 21/76802
See application file for complete search history.

(56) References Cited

U.S. PATENT DOCUMENTS 5,536,684 A * 7/1996 Dass ................. H01L 21/2257
                                                        117/8
6,126,740 A * 10/2000 Schulz ..................... C30B 5/00
                                                        117/4
(Continued)

OTHER PUBLICATIONS

L.J. Chen, "Metal Silicides: An Integral Part of Microelectronics" JOM, vol. 57, No. 9, Sep. 2005. pp. 24-31, availible at https://www.tms.org/pubs/journals/jom/0509/chen-0509.html, partial extract included (Year: 2005).*

(Continued)

*Primary Examiner* — John A Bodnar
(74) *Attorney, Agent, or Firm* — Haynes and Boone, LLP

(57) ABSTRACT

Methods of forming silicide contacts in semiconductor devices are presented. An exemplary method comprises providing a semiconductor substrate having an n-type field effect transistor (nFET) region and on a p-type field effect transistor (pFET) region; performing a pre-amorphized implantation (PAI) process to an n-type doped silicon (Si) feature in on the nFET region and a p-type doped silicon germanium (SiGe) feature in the pFET region, thereby forming an n-type amorphous silicon (a-Si) feature and a p-type amorphous silicon germanium (a-SiGe) feature; depositing a metal layer over each of the a-Si and a-SiGe features; performing an annealing process on the semiconductor device with a temperature ramp-up rate tuned according to a silicide growth rate difference between the n-type a-Si and the p-type a-SiGe features. During the annealing process the n-type a-Si and the p-type a-SiGe features are completely consumed, and amorphous silicide features are formed in the nFET and pFET regions.

20 Claims, 7 Drawing Sheets

(51) Int. Cl.
*H01L 29/16* (2006.01)
*H01L 29/161* (2006.01)
*H01L 21/324* (2006.01)
*H01L 21/8238* (2006.01)
*H01L 21/285* (2006.01)
*H01L 21/265* (2006.01)
*H01L 29/417* (2006.01)
*H01L 29/66* (2006.01)
*H01L 21/768* (2006.01)

(52) U.S. Cl.
CPC .... *H01L 21/324* (2013.01); *H01L 21/823814* (2013.01); *H01L 27/092* (2013.01); *H01L 27/0922* (2013.01); *H01L 29/16* (2013.01); *H01L 29/161* (2013.01); *H01L 29/41725* (2013.01); *H01L 29/45* (2013.01); *H01L 21/76814* (2013.01); *H01L 21/76831* (2013.01); *H01L 29/6659* (2013.01)

(56) References Cited

U.S. PATENT DOCUMENTS

| | | | | |
|---|---|---|---|---|
| 2002/0019127 | A1* | 2/2002 | Givens | H01L 21/28518 438/637 |
| 2005/0035460 | A1* | 2/2005 | Tseng | H01L 21/76807 257/760 |
| 2007/0037373 | A1* | 2/2007 | Hsiao | H01L 21/26513 438/592 |
| 2007/0231983 | A1 | 10/2007 | Shifren et al. | |
| 2008/0070370 | A1* | 3/2008 | Wu | H01L 21/26506 438/301 |
| 2008/0083955 | A1* | 4/2008 | Kanarsky | H01L 29/7845 257/382 |
| 2010/0109046 | A1* | 5/2010 | Mehandru | H01L 21/76814 257/190 |
| 2010/0224938 | A1* | 9/2010 | Zhu | H01L 21/823807 257/369 |
| 2013/0026582 | A1* | 1/2013 | Javorka | H01L 29/78 257/413 |
| 2013/0149820 | A1 | 6/2013 | Huang et al. | |
| 2013/0334693 | A1* | 12/2013 | Alptekin | H01L 21/02063 257/769 |
| 2014/0306290 | A1* | 10/2014 | Alptekin | H01L 21/823814 257/369 |

OTHER PUBLICATIONS

C. Lavoie, C. Detavernier, and P. Besser, "Nickel Silicide Technology," in L.J. Chen, editor, Silicide Technology for Integrated Circuits (London: IEE, 2004), pp. 95-152. available at https://books.google.com/books, extract included (Year: 2004).*

* cited by examiner

FORMATION OF SILICIDE CONTACTS IN SEMICONDUCTOR DEVICES

PRIORITY DATA

The present application is a divisional application of U.S. application Ser. No. 14/157,927, filed Jan. 17, 2014, which is incorporated herein by reference in its entirety.

BACKGROUND

Semiconductor practitioners are continuously working toward improved performance of semiconductor devices and/or the process of fabricating semiconductor devices. It is well known that silicides are one way to provide electrical contacts in semiconductor devices. The characteristics of contact silicides in n-type field effect transistors (nFETs) and p-type FETs (pFETs) in turn affect performance characteristics, such as contact resistance and differences between on and off currents. However, in the existing integrated circuit having both nFETs and pFETs with silicide contacts, the performances of the nFETs and pFETs are not imbalanced, especially when the nFETs and pFETs utilize different semiconductor materials. This leads to the difficulty of process integration that causes the degradations of the integrated circuit, including higher contact resistances of the source/drain in the pFETs for example.

Therefore, what is needed is the structure and the method masking the same to address the above issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
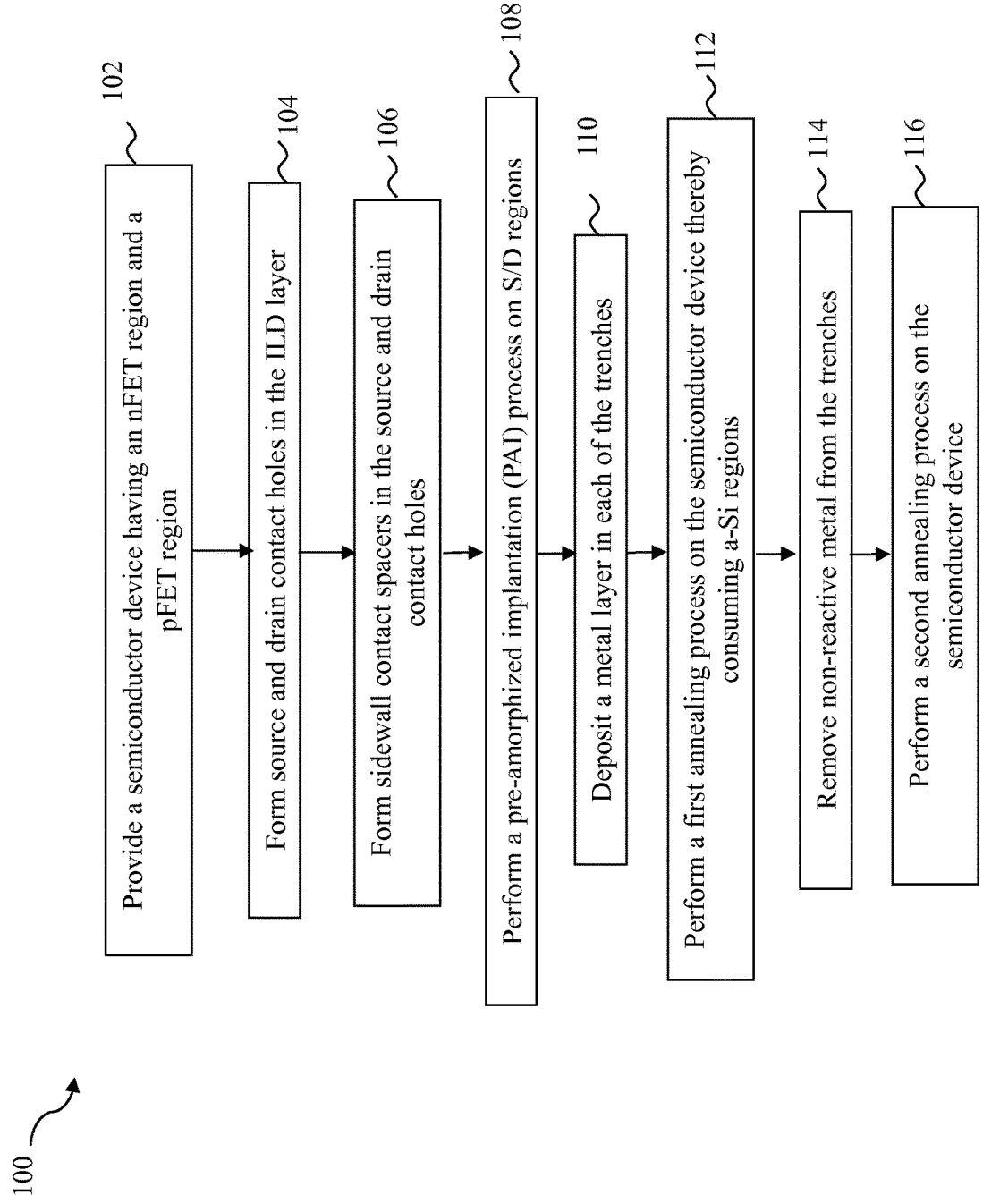
FIG. 1 is a flowchart illustrating a method of forming a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

FIG. 1 is a flowchart of one embodiment of a method 100 of making a semiconductor device. FIGS. 2 through 7 are sectional views of a semiconductor device 200 at various fabrication stages constructed according to aspects of the present disclosure in one or more embodiments. The semiconductor device 200 and the method of making the semiconductor device are collectively described with reference to FIGS. 1 through 7.

Figure 2:
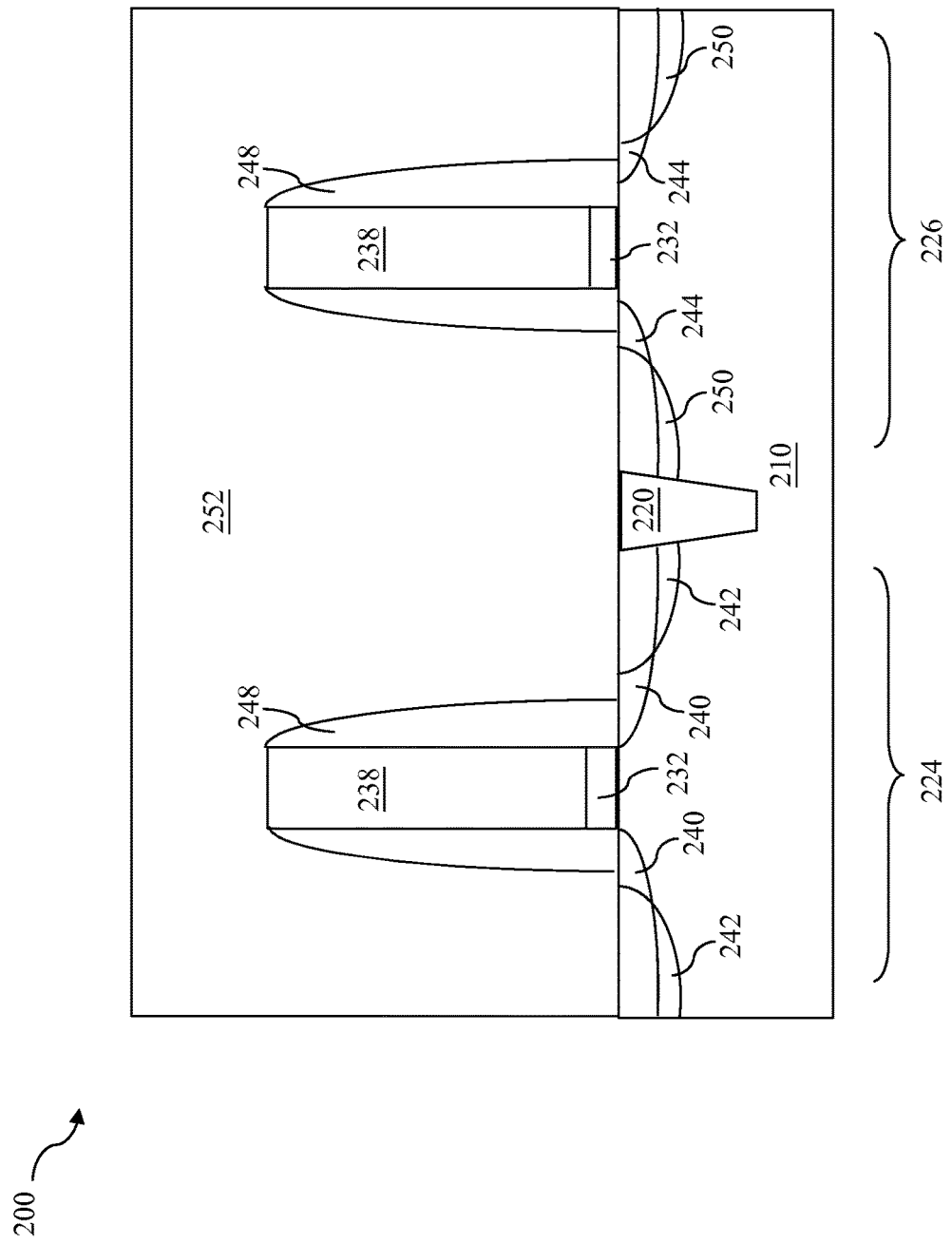
FIGS. 2 to 7 illustrate diagrammatic cross-sectional side views of one embodiment of a semiconductor device at various stages of fabrication according to the method of FIG. 1.

Referring to FIGS. 1 and 2, the method 100 begins at step 102 by providing a semiconductor device 200 having an n-type field effect transistor (nFET) region 224 and a p-type FET (pFET) region 226. In one exemplary embodiment, the nFET region 224 is a region for an nFET to be formed therein, and the pFET region 226 is a region for a pFET to be formed therein. In one example, the nFET and the pFET include metal-oxide-semiconductor (MOS) FETs such as an nMOSFET and a pMOSFET, respectively.

The semiconductor device 200 in FIG. 2 includes regions fabricated according to conventional techniques. The semiconductor device 200 includes substrate 210. The substrate 210 includes silicon (Si). Alternatively, the substrate includes germanium (Ge), silicon germanium, or other proper semiconductor materials that may be single layer or multi-layers of those combinations. The semiconductor substrate also includes various isolation features 220 such as shallow trench isolation (STI) formed in the substrate to separate the nFET region 224 from the pFET region 226. The isolation features 220 utilize isolation technology, such as STI, to define and electrically isolate various regions, such as the nFET region 224 and the pFET region 226. The isolation features 220 may include silicon oxide, silicon nitride, silicon oxynitride, other suitable materials, or combinations thereof. The semiconductor structure further comprises an inter-layer dielectric (ILD) 252. The ILD 252 includes silicon oxide, low-k dielectric material or other suitable dielectric material. The ILD 252 may be formed by deposition (such as chemical vapor deposition) and polishing (such as chemical mechanical polishing) in one embodiment. Although not shown, the area indicated using 252 may further comprise one or more contact etch step layers (CESLs).

The semiconductor device 200 further includes a gate structure for each of the nFET region 224 and the pFET region 226. Each gate structure includes gate dielectric 232 and gate electrode 238 disposed on the gate dielectric 232. The gate dielectric 232 may include silicon oxide, a dielectric material with a dielectric constant greater than the dielectric constant of the thermal silicon oxide (therefore referred to as high k dielectric material), other suitable dielectric material, or a combination thereof. The high k dielectric material layer is formed by atomic layer deposition (ALD) or other suitable process. Other methods to form the high k dielectric material layer include metal organic chemical vapor deposition (MOCVD), PVD, UV-Ozone Oxidation and molecular beam epitaxy (MBE). In one embodiment, the high k dielectric material includes HfO2. Alternatively, the high k dielectric material layer includes metal nitrides, metal silicates or other metal oxides.

The gate electrode 238 includes one or more conductive material, such as doped polycrystalline silicon, metal, metal alloy, silicide or other suitable conductive material. The gate electrode 238 may include a multilayer structure with multiple metal materials. In various embodiments, the gate electrode 238 includes other suitable conductive material, such as other suitable metal or alloy, to tune the work function for enhanced device performance including improved threshold voltage. In one example, the gate electrode 238 for the nFET includes a metal with a work function less than about 4.2 eV (referred to as n-type work function metal), such as tantalum. The gate electrode 238 for the pFET includes a metal with a work function greater than about 5.2 eV (referred to as p-type work function metal), such as titanium nitride.

In one embodiment, the gate structure is formed by a gate-last procedure that includes forming a dummy gate, forming the ILD, partially or completely removing the dummy gate (resulting in a gate trench in the ILD), and then filling the gate materials in the gate trench to form the gate structure. Another CMP process may be further applied to the substrate to remove the excessive portions of the gate electrode material, and planarize the surface for subsequent processing steps.

In one embodiment, the gate electrode 238 in the nFET region 224 includes include a tantalum layer (or other n-type metal) with an aluminum layer filled in on top. In another embodiment, the gate electrode 238 in the pFET region 226 includes titanium nitride layer with aluminum layer filled in on top. The gate electrodes for the nFET region 224 and the pFET region 226 may include other conductive materials, such as copper, tungsten, metal alloys, metal silicide, other suitable materials, or combinations thereof. In one embodiment, the gate electrode material, such as aluminum, may be formed by a suitable technique, such as physical vapor deposition (PVD), chemical vapor deposition (CVD), or other suitable technique.

The nFET region 224 further includes lightly doped source/drain (LDD) regions 240. In one embodiment, LDD regions 240 include an n-type dopant and are formed in the nFET region 224. The pFET region 226 further includes LDD regions 244. In one embodiment, LDD regions 244 include a p-type dopant and are formed in the pFET region 226. Then heavily doped source and drain (S/D) features are formed by various ion implantation processes and are substantially aligned with the outer edges of the corresponding spacers. The S/D regions 242 (sometimes referred to herein as n-type S/D regions) comprise an n-type dopant. One of the S/D regions 242 behaves as a source or source region and the other one of the S/D regions 242 behaves as a drain or drain region. In one embodiment, the S/D regions 242 comprise silicon (Si) doped with phosphorous (P). The S/D regions 250 (sometimes referred to herein as p-type S/D regions) comprise a p-type dopant. One of the S/D regions 250 behaves as a source or source region and the other one of the S/D regions 250 behaves as a drain or drain region. In one embodiment, the S/D regions 250 comprise silicon germanium (SiGe) deposition with boron (B). Although shown as having smooth edges for illustrative purposes, the S/D regions 242 and 250 may have a more irregular shape. The base material in the S/D regions 242 is different than in the S/D regions 250.

In one embodiment, the gate structures for each of the nFET 224 and pFET regions further include sidewall spacers 248. The gate spacers 248 may be formed using conventional techniques, such as a dielectric deposition and dry etching process. In one embodiment, the sidewall spacers 248 include a dielectric material, such as silicon oxide, silicon nitride, silicon oxynitride or combinations thereof. In one embodiment, the LDD regions are formed by ion implantation, the sidewall spacers 248 are formed, and then the S/D regions are formed thereafter by another ion implantation.

Figure 3:
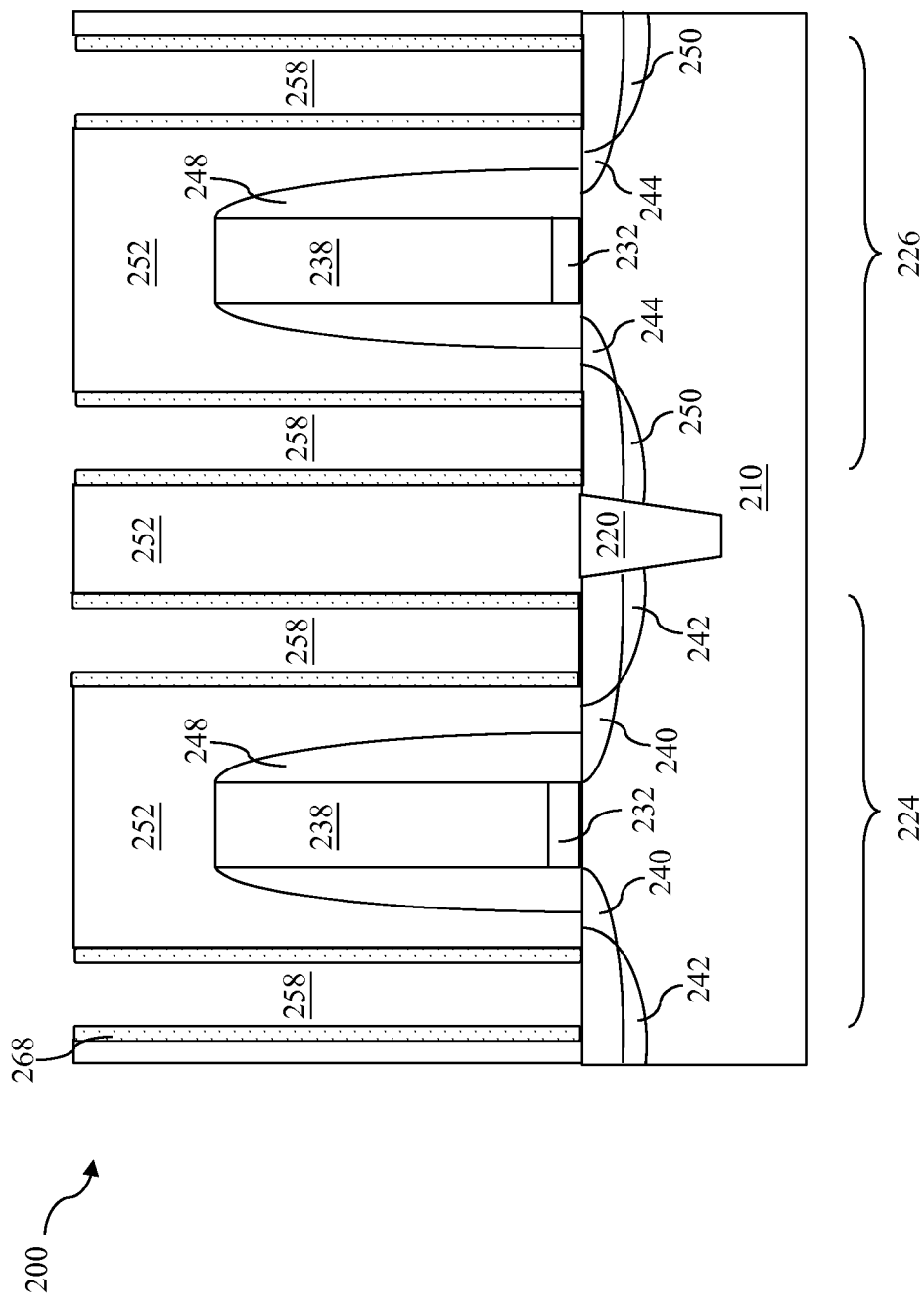

Referring to FIGS. 1 and 3, the method continues in operation 104 by forming source/drain contact holes 258. In operation 104, the source/drain contact holes 258 are formed in the nFET region 224 and the pFET region 226, and are aligned with the respective source and drain regions. The contact holes 258 are formed by photolithography process and etching. In one embodiment, the operation 104 to form the contact holes 258 includes forming a patterned photoresist layer by a photolithography process, and etching the ILD 252 by an etching process to form the contact holes using the patterned photoresist layer as an etch mask.

The patterned photoresist layer includes various openings that define the regions for the contact holes 258. As stated above, the patterned photoresist layer is formed by a photolithography process. An exemplary photolithography process may include processing steps of photoresist coating, soft baking, mask aligning, exposing, post-exposure baking, developing photoresist and hard baking. The photolithography process may be replaced by other proper methods such as maskless photolithography, electron-beam writing, or ion-beam writing.

During the etching process applied to the ILD 258, the material layers of the ILD 258 are etched away within the openings of the patterned photoresist layer. In one embodiment, the etching process utilizes a dry etching process. In one example, the dry etching process implements a fluorine-containing plasma to remove the polysilicon layer. In furtherance of the example, the etch gas includes CF4. Alternatively, the etching process may include multiple etching steps to etch the various material layers. In another embodiment, the etching process includes wet etching chemical, such as fluorine containing chemical. After the etching process, the patterned photoresist layer may be removed by wet stripping or plasma ashing.

In another embodiment, a hard mask may be alternatively used as an etch mask in the operation 104 to the contact holes 258. The hard mask includes various openings that define the regions for the contact holes. The hard mask may be formed by deposition and patterning that includes photolithography process and etching. Particularly, a hard mask material layer, such as silicon oxide or silicon nitride, is deposited on the ILD 252; a patterned photoresist layer is formed on the hard mask material layer by photolithography process; a first etch is applied to the hard mask material layer to transfer the openings from the patterned photoresist layer to the hard mask material layer, resulting in the hard mask; a second etch is applied to the ILD 252 to form the contact holes 258 using the hard mask as etch mask. The etching process applied to the hard mask material layer can be a wet etching process, a dry etching process or a combination thereof. For example, a hydrofluoric (HF) solution may be used to etch a silicon oxide hard mask layer.

In one example, the contact holes 258 includes a width ranging from about 14 nanometers (nm) to 45 nm, and a depth ranging from about 30 nm to about 300 nm.

Referring to FIGS. 1 and 3, the method continues in operation 106. In one embodiment, operation 106 includes forming contact sidewall spacers 268 in the contact holes 258. In one embodiment, the contact sidewall spacers 268 are made of titanium nitride (TiN), but the sidewall spacers 268 may be made of other suitable material, such as tantalum nitride (TaN), silicon nitride (SiN), silicon carbide (SiC), or carbon, or any combination thereof.

In the operation 106, a spacer material layer for the contact sidewall spacers 268 is deposited in the contact holes 258, by CVD, PVD, atomic layer deposition (ALD), high density plasma CVD (HDPCVD), other suitable methods, or a combination thereof according to various embodiments.

The operation 106 further includes a sidewall etch-back process that etches the spacer material layer to remove a portion in the bottom of the contact holes 258 to leave behind contact sidewall spacers 268. In one embodiment, the etch-back process includes an anisotropic etch, such as a dry etch, or Ar, N2 sputter.

In the method, silicide is to be formed on the source and drain regions to reduce the contact resistance. The characteristics of contact silicides in n-type field effect transistors (nFETs) and p-type FETs in turn affect performance characteristics, such as contact resistance and differences between on and off currents. Due to different materials used in nFETs as compared with pFETs the silicide growth rate in nFETs can exceed the silicide growth rate in pFETs, yielding greater thicknesses of silicide layers in nFETs as compared with pFETs. A desire to fully convert amorphous silicon (a-Si) to silicide during semiconductor fabrication, while at the same time keeping the silicide thickness under control can result in tradeoffs between silicide thickness and residual a-Si. For example, if the a-Si is fully consumed, the silicide may be so thick that there are concerns with junction leakage. On the other hand, if the a-Si is not fully consumed so as to keep silicide thickness under control, there are concerns with contact resistance and device degradation. Thus, there is a desire to continually reduce the imbalance in growth rate of silicides between nFETs and pFETs to improve the characteristics of the tradeoff between silicide thickness and residual a-Si.

Figure 4:
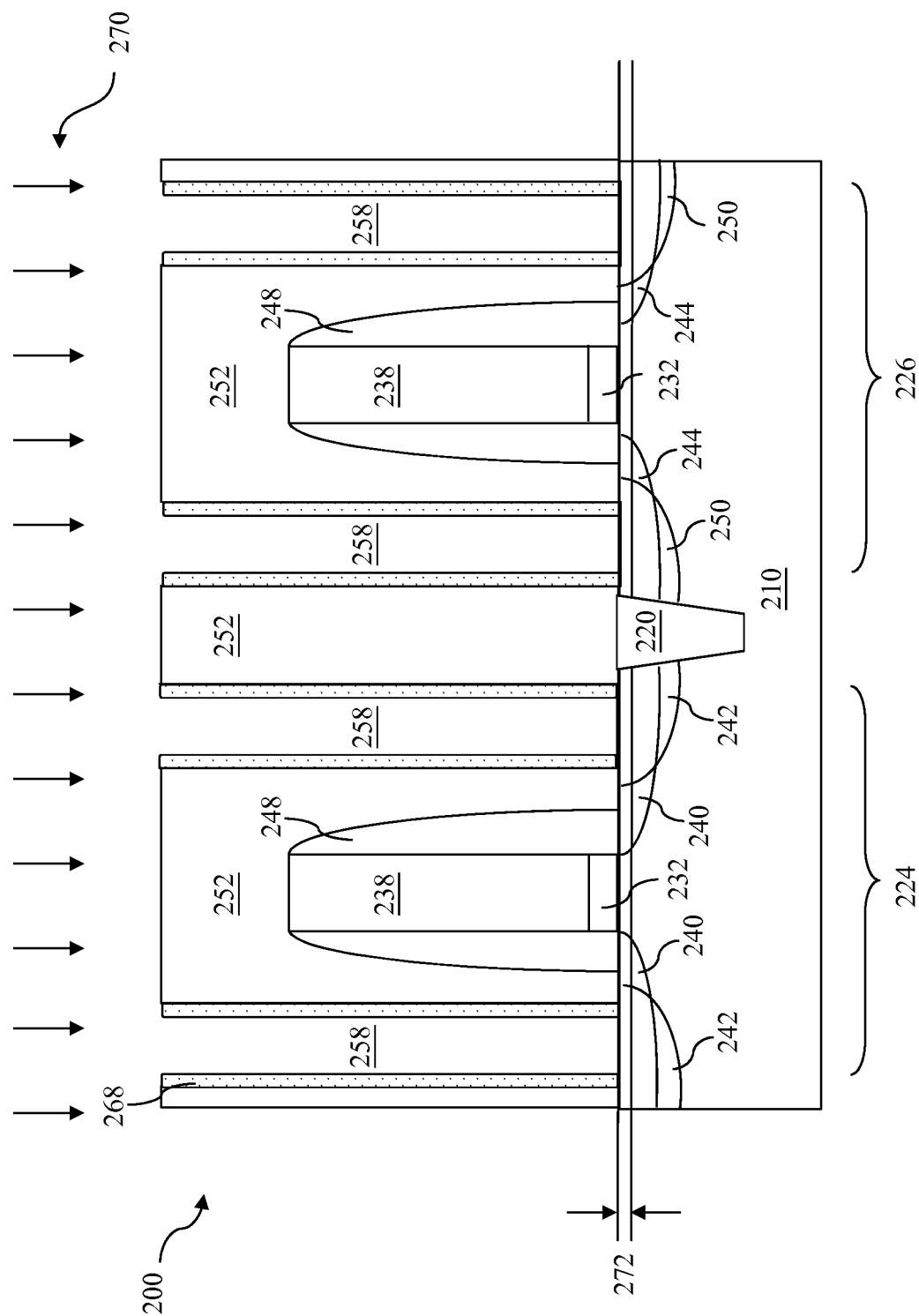

Referring to FIGS. 1 and 4, the method continues in operation 108. In operation 108, a first pre-amorphous implantation (PAI) process 270 is performed on the S/D regions 242 and 250. The PAI process 270 implants the n-type S/D regions 242 and the p-type S/D regions 250 with an implant species, damaging the lattice structure of these regions and forming amorphized regions of a depth denoted by 272 in the S/D regions 242 and S/D regions 250. The amorphized depth 272 is formed according to design specifications. In an embodiment, the amorphized depth 272 may range from about 5 nm to about 20 nm. In an embodiment, the amorphized regions in the nFET 224 comprise amorphous silicon (a-Si) and the amorphized regions in the pFET 226 comprise amorphous silicon germanium (a-SiGe).

The PAI process 270 can be tuned, for example, by controlling the implant angle, the implant energy, the implant species, and/or the implant dosage. The implant species may be any suitable species, such as Si, Ge, C, Sn, Pb, or Al, In the present embodiment, the PAI process 270 implants Si, Ge, C, Sn, Pb, or Al at an implant energy from about 5 KeV to about 10 KeV, a dosage in a range from about 1E13 atoms/cm$^2$ to about 1E16 atoms/cm$^2$, a temperature in a range from about −150° C. to about 30° C., and an implant angle in a range of about 0° to about 30°.

A patterned photoresist layer may be utilized to ensure that the amorphized regions are confined to the S/D regions 242 and p-type regions and to protect other regions of the semiconductor device 200 from implantation damage.

Figure 5:
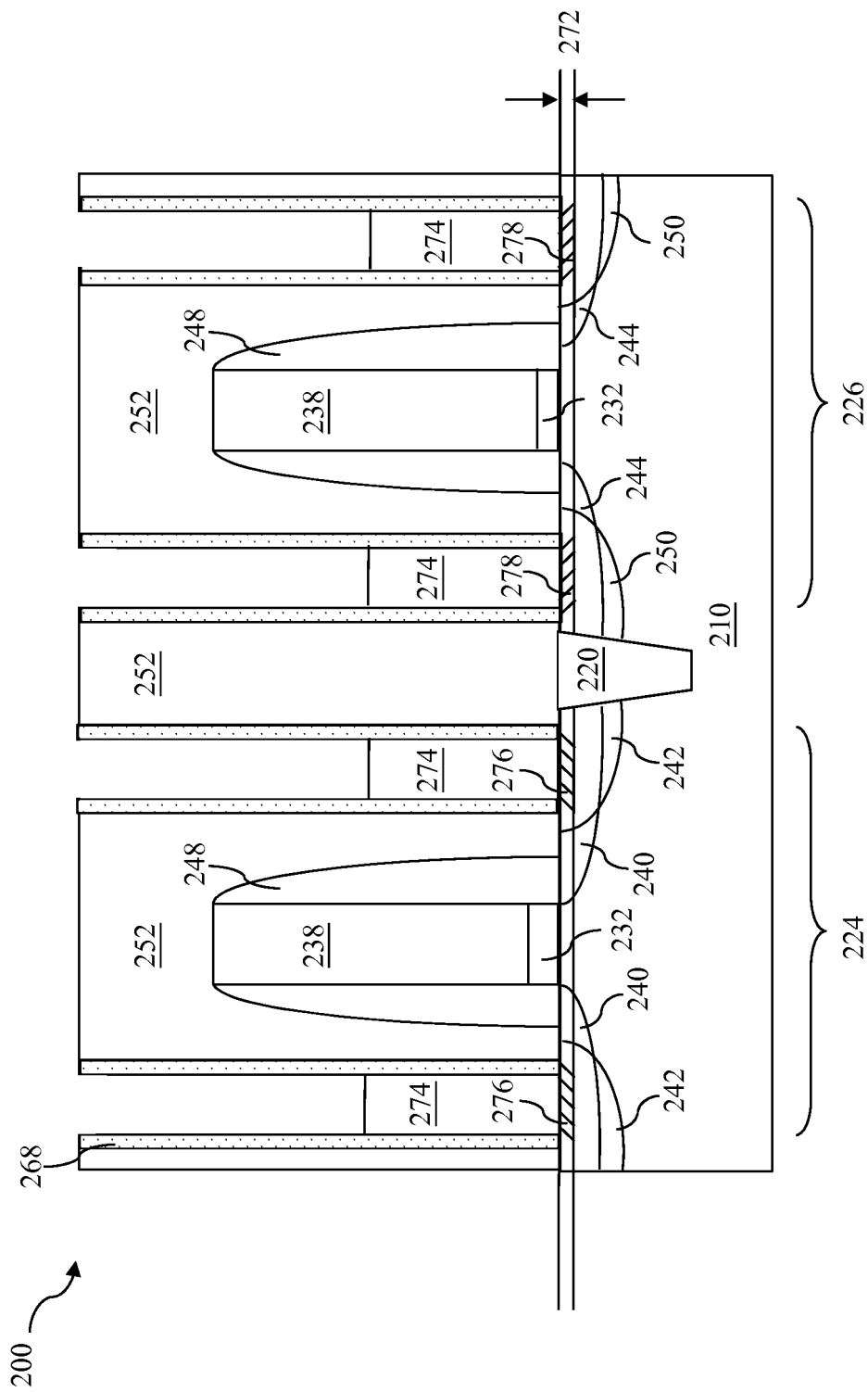

Referring to FIGS. 1 and 5, the method continues in operation 110. The PAI process 270 of step 108 results in regions of a-Si 276 in the nFET region 224 (specifically within the S/D regions 242) and a-SiGe 278 in the pFET region (specifically within S/D regions 250). In operation 110, a metal layer 274 is deposited in each of the contact holes 258 to provide a metal layer for silicide formation. Although the metal layer 274 is shown in a level in FIG. 5, only enough metal need be deposited to provide for formation of silicides as described below. The metal layer may be deposited using PVD, CVD or other suitable technique for example. In an embodiment, the metal used in the metal layer is nickel (Ni) which may have upper cap layer (TiN or Ti) or not.

Figure 6:
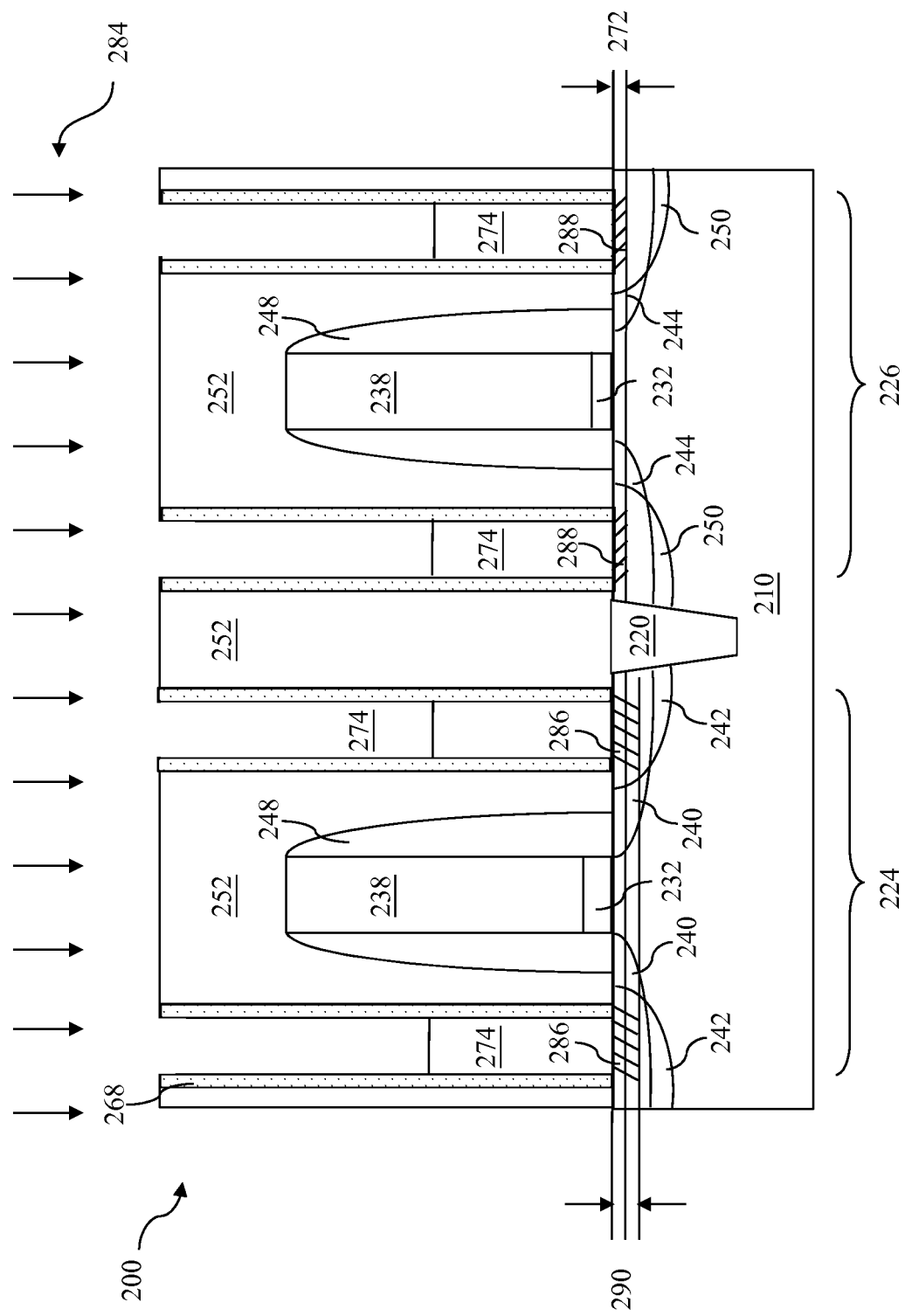

Referring to FIGS. 1 and 6, the method continues in operation 112. In operation 112, a first annealing process 284 is performed on the device 200. The first annealing process 284 causes the a-Si regions 276 to crystallize to form nFET silicide regions 286 in nFET region 224. Similarly, the first annealing process 284 causes the a-SiGe regions 278 to crystallize to form pFET silicide regions 288 in the pFET region 226. If Ni is used as the metal layer 274 and the n-type S/D regions 242 comprise Si, the nFET silicide regions 286 comprise nickel silicide (NiSi). If Ni is used as the metal layer and the p-type S/D regions comprise SiGe, then the pFET silicide regions 288 comprise a combination of NiSi, NiGe, and NiSiGe. The combination of NiSi, NiGe, and NiSiGe may be abbreviated herein as Ni(Si,Ge). Note that the nFET silicide regions 286 have a different composition than the pFET silicide regions 288.

In an embodiment, during the first annealing process 284 the growth rate of the nFET silicide regions 286 (i.e., the rate at which a-Si 276 is converted to silicide) is greater than the growth rate of the pFET silicide regions 288 (i.e., the rate at which a-SiGe 278 is converted to silicide). One concern with conventional annealing techniques is that if annealing is performed such that the a-SiGe regions 278 are fully consumed in the conversion to silicide (in pFET silicide regions 288), the nFET silicide regions 286 would be too thick (relative to the pFET silicide regions 288) to cause a concern with junction leakage. In FIG. 6, the depth of the pFET silicide regions 288 is illustrated as 272, and the depth of the nFET silicide regions is illustrated as 290. Using conventional annealing techniques, the difference in depths or thicknesses is greater than about 20 angstroms (A), which can cause excessive junction leakage. However, if the a-SiGe regions 278 are not fully consumed, for example in order to decrease the depth of the nFET silicide regions 286, a-SiGe will remain in the pFET region and will cause an excessive contact resistance and reduced mobility of the carriers. Two annealing embodiments are presented herein for consuming the a-SiGe regions 278 while at the same time ensuring that the difference in thickness between the nFET silicide regions 286 and the pFET silicide regions 288 is less than 20 A.

In an embodiment of a conventional annealing process, a temperature ramp rate (i.e., a ramp-up rate of temperature) is between about 1° C./s and about 10° C./s. The ramp rate of between about 1° C./s and about 10° C./s is used until reaching a maximum temperature of between about 180° C. and about 280° C. Once the maximum temperature is reached, the maximum temperature is maintained for between about 5 s and about 60 s. However, using the embodiment of a conventional annealing process results in a difference in thickness between nFET silicides and pFET silicides of more than 20 A. New embodiments of annealing presented herein improve upon the properties of the nFET and pFET silicides as compared with conventional annealing processes.

In one embodiment of the first annealing process 284 a temperature ramp rate of greater than about 10° C./s is used until reaching a maximum temperature of between 260° C. and 350° C. For example, the temperature ramp rate may be between about 10° C./s and about 50° C./s. In one embodiment, the starting temperature of the first annealing process 284 is the ambient temperature of the process history, which may be between 20° C. and 90° C. In an embodiment, the ambient gas during the annealing process 284 contains N2, argon (Ar), helium (He), or combinations thereof. Once the maximum temperature is reached the annealing process 284 immediately begins lowering the temperature by turning off or reducing the power to the heating elements, such as halogen lamps, while purging large gas flow (N2, Ar, or He) for cooling it to room temperature at the same time.

The annealing process is designed based on the experimental results that silicide growth rates between a-Si and a-SiGe are less different at higher temperature (e.g., in the temperature ranging from 280° C. and 350° C.) than lower temperature. Table 1 illustrates the differences in thickness between the nFET silicides 286 and the pFET silicides 288 as a result of an annealing process 284. The annealing process 284 for Table 1 uses a ramp rate of 30° C./s. Results are presented for several maximum temperatures of the annealing process 284 described above. Note that for maximum temperatures beyond about 290° C., the difference in thickness between the nFET silicides 286 and the pFET silicides 288 is less than 20 A. For example, at a temperature of 310° C., the difference in thickness between the nFET silicides 286 and the pFET silicides 288 is about 11.7 A.

TABLE 1

| Maximum temperature (° C.) | nFET silicide thickness (A) | pFET silicide thickness (A) | Difference in thickness (A) |
| --- | --- | --- | --- |
| 230 | 98.5 | 67.18 | 31.32 |
| 250 | 104.45 | 73.68 | 30.77 |
| 270 | 120.48 | 97.98 | 22.5 |
| 290 | 144.62 | 123.39 | 21.23 |
| 310 | 194.00 | 182.30 | 11.7 |

In another embodiment of the first annealing process 284 a temperature ramp rate of greater than 10° C./s is used until reaching a maximum temperature of between about 260° C. and about 300° C. For example, the temperature ramp rate may be between about 10° C./s and about 50° C./s. In one embodiment, the starting temperature of the first annealing process 284 is the ambient temperature of the process history, which may be between 20° C.~90° C. In an embodiment, the ambient gas during the annealing process 284 contains N2, Ar, He, or combinations thereof. Once the maximum temperature is reached, the maximum temperature is maintained for a duration ranging from about 1 s to about 60 s. Maintaining the maximum temperature for a period of time for the semiconductor device 200 of FIG. 6 may be referred to as soaking the semiconductor device 200 at the temperature.

Table 2 illustrates the differences in thickness between the nFET silicides 286 and the pFET silicides 288 as a result of an annealing process 284. The annealing process 284 for the results in Table 2 uses a ramp rate of 10° C./s~50° C./s until reaching a maximum temperature of about 260° C.~300° C. The maximum temperature is maintained for various soak times presented in Table 2. Note that soak times beyond about 20 s yield difference in thickness between the nFET silicides 286 and the pFET silicides 288 of less than 20 A.

TABLE 2

| Soak time (s) | nFET silicide thickness (A) | pFET silicide thickness (A) | Difference in thickness (A) |
| --- | --- | --- | --- |
| 0 | 120.48 | 97.98 | 22.5 |
| 5 | 138.83 | 110.72 | 28.11 |
| 10 | 171.70 | 149.92 | 21.78 |
| 20 | 178.45 | 163.49 | 14.96 |
| 30 | 193.45 | 180.23 | 13.22 |

The embodiments of the first annealing process 284 described above have the following benefits. First, there is little to no residual a-SiGe remaining in the pFET region 226 after the first annealing process 284 as the a-SiGe is consumed and turned into pFET silicide regions 288 comprising NiSi, NiGe, NiSiGe, or some combination thereof. At the same time, the nFET silicide regions 286 do not become thick enough to cause junction leakage concerns as a result of the first annealing process 284. The embodiments of the first annealing process 284 have the added benefit of enhancing wafer per hour (WPH) throughput due to the high ramp-up rates. The embodiments of the first annealing process 284 may be achieved using halogen annealing, for example, using tugsten-halogen lamps.

Figure 7:
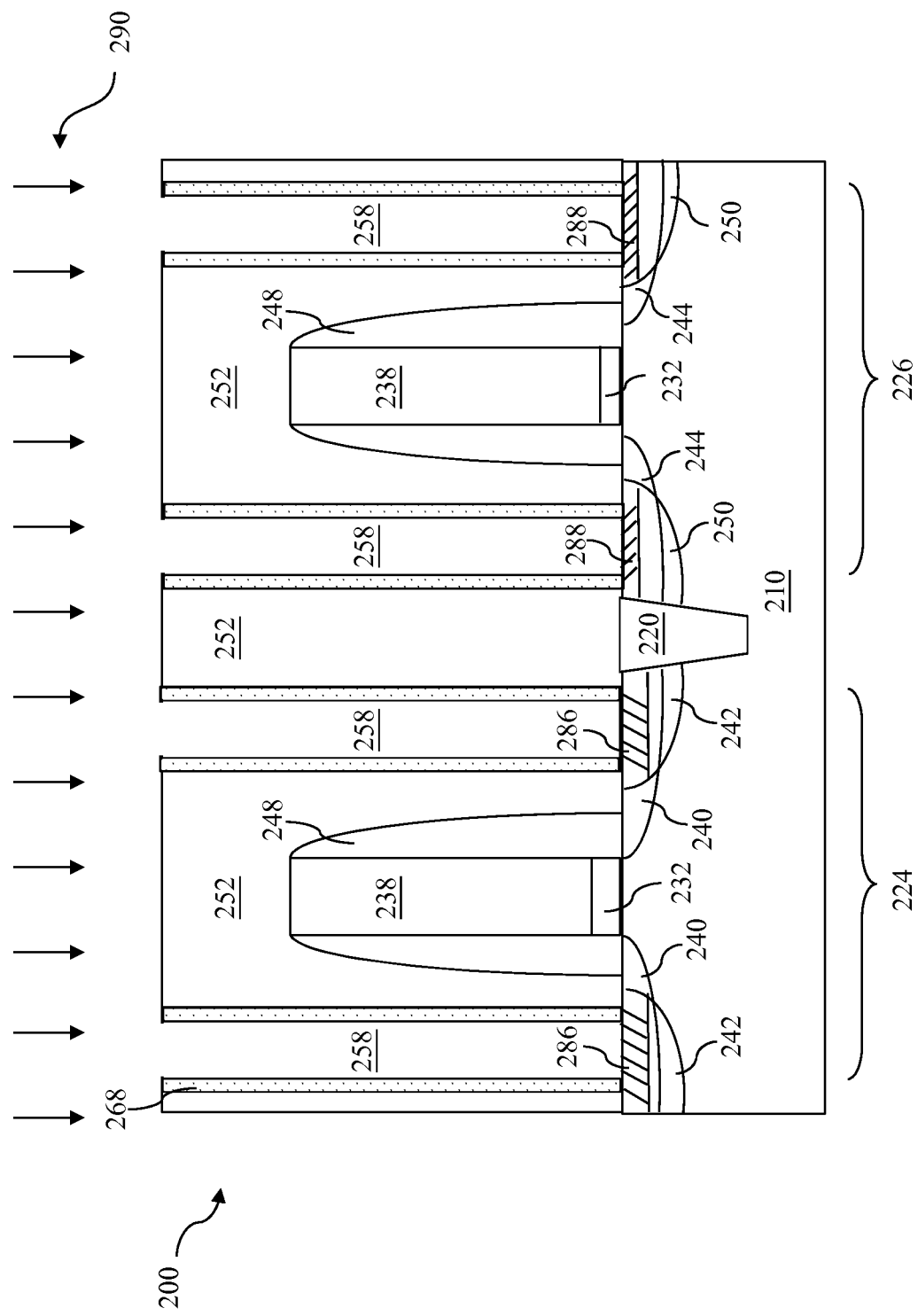

Referring to FIGS. 1 and 7, the method continues in operation 114. In operation 114, the non-reactive portion of the metal layer 274 of FIG. 6 is removed from the device 200 to yield contact holes 258. Wet etching may be used to selectively remove the non-reactive portion of the metal layer 274 but not remove silicide (e.g., NiSi) in the nFET silicide regions 286 and not remove the pFET silicide regions 288.

Referring still to FIGS. 1 and 7, the method continues in operation 116. In operation 116, a second annealing process 290 may be performed on the device 200. In one embodiment, the second annealing process is implemented with an annealing temperature tuned to convert the silicide from one phase with low conductivity to another phase with higher conductivity. The second annealing process includes an annealing temperature greater than that of the first annealing process and an annealing duration less than that of the first annealing process. In one example, the second annealing process 290 is performed using a temperature between about 700° C. and about 900° C. for about one-ten-thousandth (1/10,000 or 1E-4) s. In an embodiment, the second annealing process 290 uses laser annealing.

Note that the PAI process of operation 108 is incorporated in the method 100 and is designed in order to eliminate or reduce the imbalance between the nFET silicides 286 and the pFET silicides 288. Suppose that the method 100 did not include the PAI process 270. Not having the PAI process 270 could ostensibly provide the benefit that there is no a-Si so a person of ordinary skill does not have to address how to consume a-Si. However, the growth rate of NiSi in the nFET region 224 is greater than the growth rate of Ni(Si,Ge) in the pFET region 226 such that the thickness difference between the silicide in the nFET region 224 and the silicide in the pFET region 226 is greater than 20 A, which is undesirable. In such a scenario, NiSi is converted from crystal Si, so NiSi is also crystallized. A semiconductor structure formed using the method 100 can be distinguished from a semiconductor structure that uses a method similar to method 100 but without the PAI process in step 108 by using transmission electron microscopy (TEM) diffraction patterns of the NiSi. In a semiconductor structure formed using method 100, the TEM pattern of the Ni silicides in the semiconductor structure has a ring pattern only, whereas in a semiconductor structure formed using a method similar to method 100 but without a PAI process as in step 108 the TEM pattern on NiSi in the semiconductor structure has a spot pattern or a spot pattern with a partial weak ring. Thus, the Ni silicides formed using the method 100 have an amorphous structure.

Another technique that may be used in place of operation 108 is a technique in which a different PAI process is applied to each of the nFET region 224 and the pFET region 226 to try to account for the different compositions of the S/D regions 242 as compared with the S/D regions 250. In this case, a hard mask may be first applied to the nFET region 224 while a first PAI process is applied to the pFET region 226. Then the hard mask is removed from the nFET region 224 and a hard mask is applied to the pFET region 226, followed by a second PAI process applied to the nFET region 224. The double-PAI process provides a degree of freedom for addressing the different materials on the S/D regions 242 compared with the S/D regions 250.

Subsequent processing may further form various contacts/vias/lines and multilayer interconnect features (e.g., metal layers and interlayer dielectrics) on the substrate 210, configured to connect the various features or structures of the semiconductor device 200. The additional features may provide electrical interconnection to the device 200. In one embodiment, contact features are formed on the contact holes 258 and are electrically coupled with the source and drain regions through the corresponding silicide. The contact features may be formed by a procedure that includes deposition and polishing. For example, a conductive material, such as, tungsten, copper, aluminum, or other suitable metal or metal alloy, is deposited in the contact holes 258 by a suitable technique, such as PVD. Then the excessive metal deposited on the ILD 252 is removed by a suitable process, such as CMP that further planarizes the top surface the semiconductor device 200.

In another embodiment, further formed is a multilayer interconnection that includes vertical interconnects, such as conventional vias or gate electrode contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The disclosed semiconductor device 200 may be used in various microelectronic devices, such as in digital logic circuits, imaging sensor devices, system of chip(SoC), dynamic or static random access memory (RAM) cells, flash memory, and/or other microelectronic devices.

Various embodiments are provided on the semiconductor device 200 and the method making the same. In one embodiment, the method for making the semiconductor device 200 includes performing a PAI process on a nFET region and a pFET region of the semiconductor device to generate an n-type a-Si region and a p-type a-Si region; and forming silicide to source and drain regions by performing a first annealing process to form silicide regions on the semiconductor device. The first annealing process includes a temperature ramp up rate tuned according to the difference between the silicide growth rate in the nFET and the silicide growth rate in the pFET. In the present example, the first annealing process includes increasing temperature at a rate greater than about 10° C./s, wherein during the first annealing process the a-Si regions are completely consumed, a first silicide region is formed in the nFET region, and a second silicide region is formed in the pFET region, and wherein the difference in thickness between the first silicide region and the second silicide region is less than about 20 Å.

In another embodiment, the semiconductor device formed thereby includes amorphous silicide features on the source and drain regions. The silicide features in the nFET and pFET are balanced in term of thickness and device performance. Especially, the silicide features in the nFET include a-Si and the silicide features in the pFET include a-SiGe, which is characterized by TEM diffraction patterns in the experiments.

Various advantages may present in one or more embodiments. In one embodiment, there is little to no residual a-SiGe remaining in the pFET region 226 after the first annealing process 284 as the a-SiGe is consumed and turned into pFET silicide regions 288 comprising NiSi, NiGe, NiSiGe, or some combination thereof. At the same time, the nFET silicide regions 286 do not become thick enough to cause junction leakage concerns as a result of the first annealing process 284. In another embodiment, the first annealing process 284 has the added benefit of enhancing wafer per hour (WPH) throughput due to the high ramp rates.

Provided herein are embodiments of methods for making a semiconductor device. In one embodiment, a method comprises providing a semiconductor substrate having an n-type field effect transistor (nFET) region and on a p-type field effect transistor (pFET) region; performing a pre-amorphized implantation (PAI) process to an n-type doped silicon (Si) feature in on the nFET region and a p-type doped silicon germanium (SiGe) feature in the pFET region, thereby forming an n-type amorphous silicon (a-Si) feature and a p-type amorphous silicon germanium (a-SiGe) feature; depositing a metal layer over each of the n-type a-Si feature and the p-type a-SiGe feature; performing a first annealing process on the semiconductor device with a temperature ramp-up rate tuned according to a silicide growth rate difference between the n-type a-Si feature and a p-type a-SiGe feature. During the first annealing process the n-type a-Si and the p-type a-SiGe features are completely consumed, a first amorphous silicide feature is formed in the nFET region, and a second amorphous silicide feature is formed in the pFET region.

In another embodiment, a method comprises providing a semiconductor substrate having a first feature of a first semiconductor material in an nFET region and a second feature of a second semiconductor material in a pFET region; forming a first contact trench in a dielectric material to provide access to the first feature, wherein the dielectric material overlies a surface of the substrate; forming a second contact trench in the dielectric material to provide access to the second feature; performing a PAI process on the first feature to form an n-type a-Si region and on the second feature to form a p-type a-Si region; depositing a first metal layer in the first contact trench over the n-type a-Si region; depositing a second metal layer in the second contact trench over the p-type a-Si region; performing a first annealing process on the semiconductor device thereby forming a first silicide feature in the nFET region and a second silicide feature in the pFET region, wherein the formation of the first silicide feature completely consumes the n-type amorphous semiconductor region, and wherein the formation of the second silicide feature completely consumes the p-type amorphous semiconductor region. In an embodiment, the first annealing process is performed such that the difference in thickness between the first silicide feature and the second silicide feature is less than about 20 angstroms.

Embodiments of semiconductor devices are also presented herein. In one embodiment, a semiconductor device comprises: a substrate comprising: an n-type S/D region, wherein the n-type S/D region comprises a first silicide region; and a p-type S/D region, wherein the p-type S/D region comprises a second silicide region; an n-type gate overlying a surface of the substrate; and a p-type gate overlying the surface of the substrate. An embodiment may also comprise wherein the first metal layer and the second metal layer are Ni layers, wherein the first semiconductor material is n-type doped Si, and wherein the second semiconductor material is p-type doped SiGe. In an embodiment, the semiconductor device does not comprise amorphous silicide.

In another embodiment, a semiconductor device comprises: a substrate having an nFET and a pFET; an n-type source and drain (S/D) region in the nFET; a first silicide feature directly on the n-type S/D region; a p-type S/D region in the pFET; and a second silicide feature directly on the p-type S/D region. In an embodiment, the first silicide feature and the second silicide feature do not comprise amorphous silicide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate having a n-type field effect transistor (nFET) and a p-type FET (pFET);
   an n-type source and drain (S/D) region in the nFET, the n-type S/D region having a first crystalline structure and comprising n-type doped silicon;
   a first silicide feature disposed within a portion of the n-type S/D region, the first silicide feature physically contacting material of the n-type S/D region, the first silicide feature comprising nickel silicide and having a first thickness;
   a p-type S/D region in the pFET, the p-type S/D region having a second crystalline structure and comprising p-type doped silicon germanium, wherein the p-type S/D region is free of amorphous silicon germanium;
   a second silicide feature disposed within a portion of the p-type S/D region, the second silicide feature physically contacting material of the p-type S/D region, the second silicide feature comprising nickel silicide, nickel germanide (NiGe), and nickel germanosilicide (NiSiGe), and having a second thickness different than the first thickness;
   a first contact trench extending through an interlayer dielectric layer to the first silicide feature; and
   a first dielectric sidewall spacer extending along a sidewall of the first contact trench to the first silicide feature such that a first portion of a top surface of the first silicide feature is in direct contact with and covered by the first dielectric sidewall spacer and a second portion of the top surface of the first silicide feature is free of the first dielectric sidewall spacer,
   wherein both the first thickness and the second thickness are greater than 100 A and a difference between the first thickness and the second thickness is less than 20 A.

2. The semiconductor device of claim 1, wherein the n-type S/D region and the p-type S/D region further comprise a same implant species selected from the group consisting of C, Sn, Pb, and Al.

3. The semiconductor device of claim 1, further comprising:
   a first contact feature disposed within the first contact trench and in direct contact with both the first dielectric sidewall spacer and the first silicide feature;
   a second contact trench extending through the interlayer dielectric layer to the second silicide feature;
   a second dielectric sidewall spacer extending along a sidewall of the second contact trench to the second silicide feature such that a first portion of a top surface of the second silicide feature is in direct contact with and covered by the second dielectric sidewall spacer and a second portion of the top surface of the second silicide feature is free of the second dielectric sidewall spacer; and
   a second contact feature disposed within the second contact trench and in direct contact with both the second dielectric sidewall spacer and the second silicide feature.

4. The semiconductor device of claim 1, wherein the first dielectric sidewall spacer comprises titanium nitride (TiN), tantalum nitride (TaN), silicon nitride (SiN), silicon carbide (SiC), or carbon.

5. A semiconductor device comprising:
   a substrate having a n-type field effect transistor (nFET) region and a p-type FET (pFET) region;
   an n-type source and drain (S/D) region in the nFET region, the n-type S/D region having a first crystalline structure;
   a first silicide region embedded in a top portion of the n-type S/D region, the first silicide region comprising nickel silicide and having a first thickness, wherein sidewalls and a bottom surface of the first silicide region directly contact material of the n-type S/D region;
   a p-type S/D region in the pFET region, the p-type S/D region having a second crystalline structure, wherein the p-type S/D region is free of amorphous silicon germanium;
   a second silicide region embedded in a top portion of the p-type S/D region, the second silicide region comprising nickel silicide, nickel germanide (NiGe), and nickel germanosilicide (NiSiGe) and having a second thickness different than the first thickness, wherein sidewalls and a bottom surface of the second silicide region directly contact material of the p-type S/D region;
   a contact trench extending through an interlayer dielectric layer to the first silicide region;
   a dielectric sidewall spacer extending along a sidewall of the contact trench to the first silicide region such that a first portion of a top surface of the first silicide region is in direct contact with and covered by the dielectric sidewall spacer and a second portion of the top surface of the first silicide region is free of the dielectric sidewall spacer; and
   a contact feature disposed within the contact trench and in direct contact with both the dielectric sidewall spacer and the second portion of the top surface of the first silicide region,
   wherein a difference in thickness between the first silicide region and the second silicide region is less than 20 angstroms (A), wherein the n-type S/D region and the p-type S/D region further comprise a same implant species selected from the group consisting of C, Sn, Pb, and Al.

6. A device comprising:
a substrate including a n-type field effect transistor (nFET) region and a p-type FET (pFET) region, wherein the nFET region and the pFET region are separated by an isolation feature;
an n-type source and drain (S/D) region in the nFET region, wherein the n-type S/D region comprises a first silicide feature disposed therein, the n-type S/D region having a first crystalline structure, the first silicide feature including nickel silicide, wherein the first silicide feature directly contacts material of the n-type S/D region;
a p-type S/D region in the pFET region, wherein the p-type S/D region comprises a second silicide feature disposed therein, the p-type S/D region having a second crystalline structure, the second silicide feature including nickel germanosilicide (NiSiGe), wherein the second silicide feature directly contacts material of the p-type S/D region, wherein the p-type S/D region is free of amorphous silicon germanium;
a first contact trench extending through an interlayer dielectric layer to the first silicide feature, wherein a bottommost surface of the interlayer dielectric layer facing the substrate physically contacts a first portion of the substrate including the first silicide feature, and wherein the bottommost surface of the interlayer dielectric layer facing the substrate physically contacts a second portion of the substrate extending from an edge of the first silicide feature to an edge of an interface between the substrate and a gate spacer disposed thereon, wherein the second portion of the substrate is free of amorphous silicide;
a first dielectric sidewall spacer extending along a sidewall of the first contact trench to the first silicide feature such that a first portion of a top surface of the first silicide feature is in direct contact with and covered by the first dielectric sidewall spacer and a second portion of the top surface of the first silicide feature is free of the first dielectric sidewall spacer; and
a first contact feature disposed within the first contact trench and in direct contact with the first dielectric sidewall spacer and the second portion of a top surface of the first silicide feature,
wherein the first silicide feature has a first thickness, the second silicide feature has a second thickness different than the first thickness, and both the first thickness and the second thickness are greater than 100 A, and
wherein a difference between the first thickness and the second thickness is less than 20 A.

7. The device of claim 6, further comprising:
a second contact trench extending through the interlayer dielectric layer to the second silicide feature;
a second dielectric sidewall spacer extending along a sidewall of the second contact trench to the second silicide feature such that a first portion of a top surface of the second silicide feature is in direct contact with and covered by the second dielectric sidewall spacer and a second portion of the top surface of the second silicide feature is free of the second dielectric sidewall spacer; and
a second contact feature disposed within the second contact trench and in directly contact with both the second dielectric sidewall spacer and the second silicide feature.

8. The device of claim 6, wherein the first contact feature covers the second portion of the top surface of the first silicide feature.

9. The semiconductor device of claim 3, wherein the first contact feature covers the second portion of the top surface of the first silicide feature.

10. The semiconductor device of claim 1, wherein the n-type doped silicon comprises phosphorous doped silicon, and the p-type doped silicon germanium comprises boron doped silicon germanium.

11. The device of claim 6, wherein the top surface of the first silicide feature and a top surface of the n-type S/D region are co-planar, and wherein a top surface of the second silicide feature and a top surface of the p-type S/D region are co-planar.

12. The device of claim 6, wherein the n-type S/D region and the p-type S/D region further comprise a same implant species selected from the group consisting of C, Sn, Pb, and Al.

13. The semiconductor device of claim 1, further comprising a gate structure associated with the n-type S/D region and the p-type S/D region.

14. The semiconductor device of claim 1, wherein the second thickness is less than the first thickness.

15. The semiconductor device of claim 5, wherein the n-type S/D region includes doped silicon (Si), and wherein the p-type S/D region includes doped silicon germanium (SiGe).

16. The semiconductor device of claim 5, wherein the second thickness is less than the first thickness.

17. The device of claim 6, wherein the n-type S/D region includes doped silicon (Si), and wherein the p-type S/D region includes doped silicon germanium (SiGe).

18. The device of claim 6, wherein the first dielectric sidewall spacer comprises titanium nitride (TiN), tantalum nitride (TaN), silicon nitride (SiN), silicon carbide (SiC), or carbon.

19. The device of claim 6, wherein the second thickness is less than the first thickness.

20. The semiconductor device of claim 5, wherein both the first thickness and the second thickness are greater than 100 A.

* * * * *